(12) United States Patent
Bidnyk et al.

(10) Patent No.: US 8,126,300 B2
(45) Date of Patent: Feb. 28, 2012

(54) SEGMENTED WAVEGUIDE STRUCTURE

(75) Inventors: Serge Bidnyk, Ottawa (CA); Ashok Balakrishnan, Ottawa (CA); Matt Pearson, Ashton (CA)

(73) Assignee: Enablence Inc., Kanata (CA)

( * ) Notice: Subject to any disclaimer, the term of this patent is extended or adjusted under 35 U.S.C. 154(b) by 433 days.

(21) Appl. No.: 12/486,002

(22) Filed: Jun. 17, 2009

(65) Prior Publication Data
US 2009/0310913 A1 Dec. 17, 2009

Related U.S. Application Data

(60) Provisional application No. 61/073,152, filed on Jun. 17, 2008, provisional application No. 61/073,045, filed on Jun. 17, 2008.

(51) Int. Cl.
*G02B 6/26* (2006.01)
*G02B 6/34* (2006.01)
*G02B 6/42* (2006.01)

(52) U.S. Cl. .......................................... 385/28; 385/37

(58) Field of Classification Search .............. 385/28, 385/37, 38, 39, 125, 129, 147; 359/572
See application file for complete search history.

(56) References Cited

U.S. PATENT DOCUMENTS

| | | | | |
|---|---|---|---|---|
| 5,745,618 A * | 4/1998 | Li | ..................................... | 385/46 |
| 6,823,111 B2 * | 11/2004 | Jette et al. | ........................ | 385/37 |
| 6,892,004 B1 * | 5/2005 | Yu | ..................................... | 385/39 |
| 6,937,799 B2 * | 8/2005 | Matsushima et al. | ........... | 385/50 |
| 7,006,729 B2 | 2/2006 | Wang et al. | ..................... | 385/37 |
| 7,068,885 B2 | 6/2006 | Bidnyk et al. | ................... | 385/37 |
| 7,130,518 B2 * | 10/2006 | Yamazaki | ..................... | 385/129 |
| 7,149,387 B2 | 12/2006 | Balakrishnan et al. | ......... | 385/37 |
| 7,151,635 B2 | 12/2006 | Bidnyk et al. | ................. | 359/572 |
| 7,212,709 B2 | 5/2007 | Hosai et al. | ..................... | 385/37 |
| 7,343,071 B2 * | 3/2008 | Laurent-Lund | ................. | 385/45 |
| 2005/0025429 A1 * | 2/2005 | Jepsen et al. | .................... | 385/50 |

OTHER PUBLICATIONS

Castro et al., "Demonstration of mode conversion using anti-symmetric waveguide Bragg gratings", Optics Express; vol. 13, No. 11; pp. 4180-4184, May 30, 2005.
International Search Report from corresponding PCT Application No. PCT/CA2009/000843, PCT Search Date Sep. 9, 2009.

* cited by examiner

*Primary Examiner* — Akm Ullah
(74) *Attorney, Agent, or Firm* — Osler, Hoskin & Harcourt LLP

(57) ABSTRACT

Segmented waveguide structures provide mode matching in planar lightwave circuits between waveguides and other waveguiding structures, e.g. slab waveguides and optical fibers. The present invention eliminates back reflections from the core segments by etching the leading and trailing faces of the core segments with a plurality of parallel facet sections, which are rearwardly offset in the transmission direction by an odd number of quarter wavelengths.

15 Claims, 11 Drawing Sheets

A Segmented Structure with back reflections

A Segmented Structure with randomly offset sections

SEGMENTED WAVEGUIDE STRUCTURE

CROSS-REFERENCE TO RELATED APPLICATIONS

The present invention claims priority from U.S. Provisional Patent Application Nos. 61/073,152 and 61/073,045, both filed Jun. 17 2008, which are incorporated herein by reference.

TECHNICAL FIELD

The present invention relates to a segmented waveguide structure, and in particular to a segmented waveguide structure with controlled back reflections.

BACKGROUND OF THE INVENTION

Segmented structures are conventionally used in planar waveguide structures to act as fiber-to-waveguide couplers (FWC), Bragg gratings, or other such structure, whereby the geometry of the segmented structures is chosen to optimize some feature in transmission. For example, an FWC gradually enables an optical mode to expand or contract to match the mode of an optical fiber to the mode most conveniently carried within the planar waveguide structure. The reflection from the interface of any element of a segmented structure is generally very small; however, if many segmented structures are employed, the reflection from each interface of each segment will add to the reflection of other interfaces to produce a potentially large cumulative back reflection. In the case where the segments are "random", or of no particular period, the individual segment reflections will accumulate to a relatively wavelength independent back reflection. In the case where the segments are periodic, the cumulative effect will show strong back reflections at specific wavelengths, and weaker reflections in between those wavelengths. Cumulative back reflections exceeding approximately −35 dB (approximately 0.03%) can be unacceptable in many waveguide applications, e.g. if the waveguide is receiving light from a laser. FIG. 1 illustrates a conventional segmented waveguide structure 1, in which the segments 2 are made of core material (dashed filled), and are surrounded by cladding material 3 for guiding light 4 between a continuous waveguide section 5 and an edge 6 of the structure 1, wherein the segments 2 have progressively smaller widths. Examples of devices including segmented waveguides are illustrated in U.S. Pat. No. 5,745,618 issued Apr. 28, 1998 to Li; U.S. Pat. No. 6,892,004 issued May 10, 2005 to Yu; U.S. Pat. No. 7,006,729 issued Feb. 28, 2006 to Wang et al; U.S. Pat. No. 7,130,518 issued Oct. 31, 2006 to Yamazaki et al; and U.S. Pat. No. 7,212,709 issued May 1, 2007 to Hosai et al.

The segmented waveguides 2 are positioned in transition areas to provide mode expansion or mode contraction depending upon which direction the light 4 travels. The mode expansion and contractions are used to gradually match an optical field of an optical signal in the waveguide section 5 to optical fields of corresponding optical signals in the adjacent guiding structures optically coupled to the segmented waveguides 2, e.g. optical fibers, slab waveguides etc, connected to the edge 6.

Unfortunately, there is a reflection from each interface between the core segments 2 and the cladding 3, which can combine coherently when the segments 2 are positioned periodically or quasi-periodically, e.g. spaced at a distance equal to the wavelength ($\lambda$) of the transmitted light or multiples thereof. In FIG. 2, a conventional method of reducing back reflections is demonstrated in a randomly offset, e.g. not periodic, segmented device 7 in which each of the aforementioned segments 2, shown in solid outline, is moved in some random but small amount from its nominal location, resulting in repositioned segments 2', shown in phantom outline. The feedback from randomly repositioned segments 2' will likely not add together coherently after repositioning, thereby suppressing some back reflection; however, randomizing has limited benefits, and provides only from 10 dB to 20 dB of back reflection suppression. Alternatively, the widths of individual segments might vary to achieve the same randomization effect (not shown here).

An object of the present invention is to overcome the shortcomings of the prior art by providing a means for modifying and, when necessary, substantially suppressing cumulative back reflection from segmented planar waveguide structures.

SUMMARY OF THE INVENTION

Accordingly, the present invention relates to a planar lightwave circuit (PLC) device comprising:

a waveguide structure including:

a core for transmitting optical signals in a light transmission direction, having a transition area at an end thereof for optically coupling to an adjacent optical element, wherein the transition area of the core includes core segments separated by cladding sections in the light transmission direction for mode matching the optical signals between the core and the adjacent optical element; and cladding surrounding the core for guiding the optical signals substantially in the core;

wherein each core segment includes a first face and a second face through which the optical signals pass in the light transmission direction;

wherein the first face includes a first section and a second section; and wherein the first section is rearwardly offset from the second section, whereby back reflections from the first section of the first face at least partially cancel back reflections from the second section of the first face.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
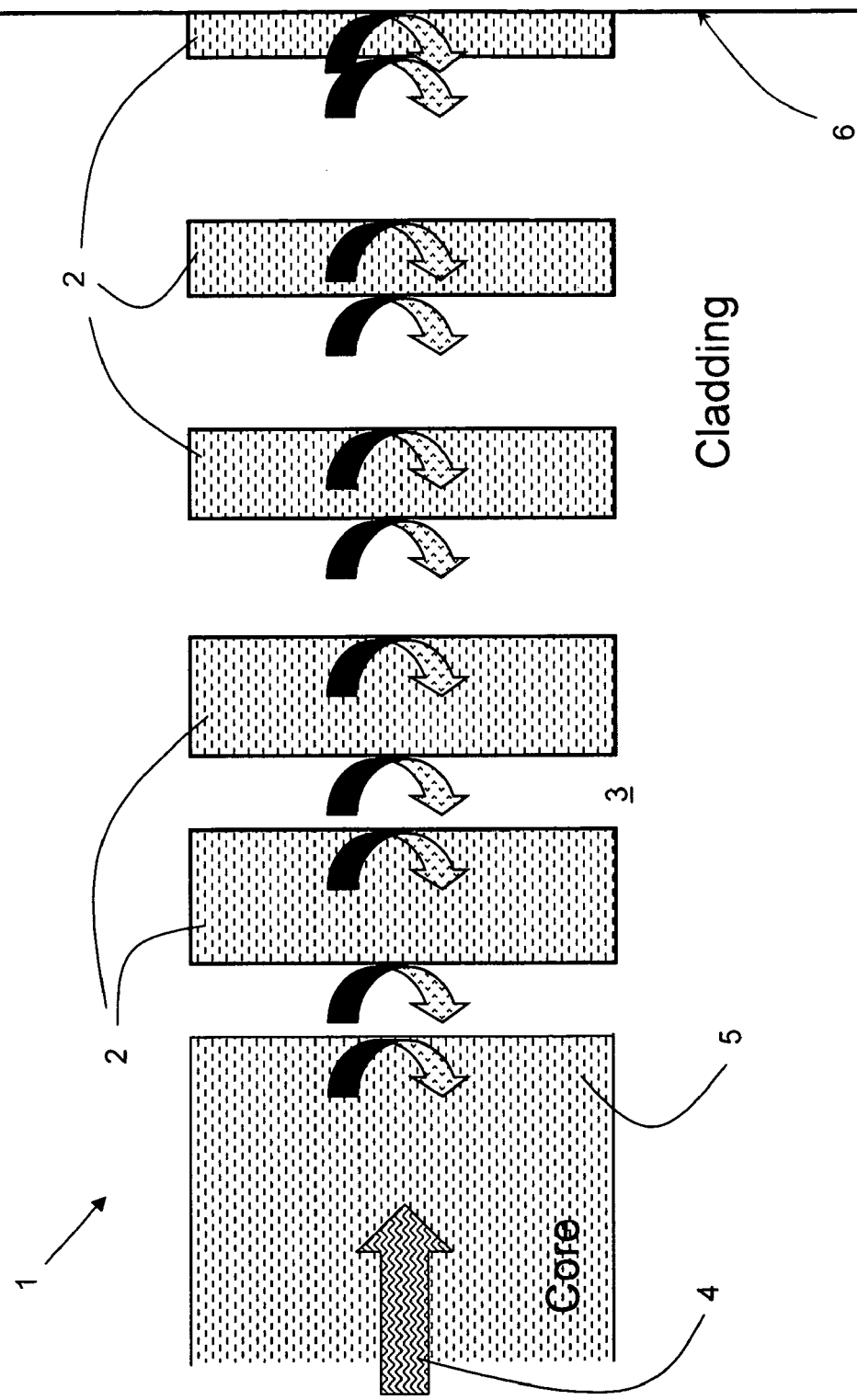
FIG. 1 illustrates a conventional segmented waveguide structure.
Figure 2:
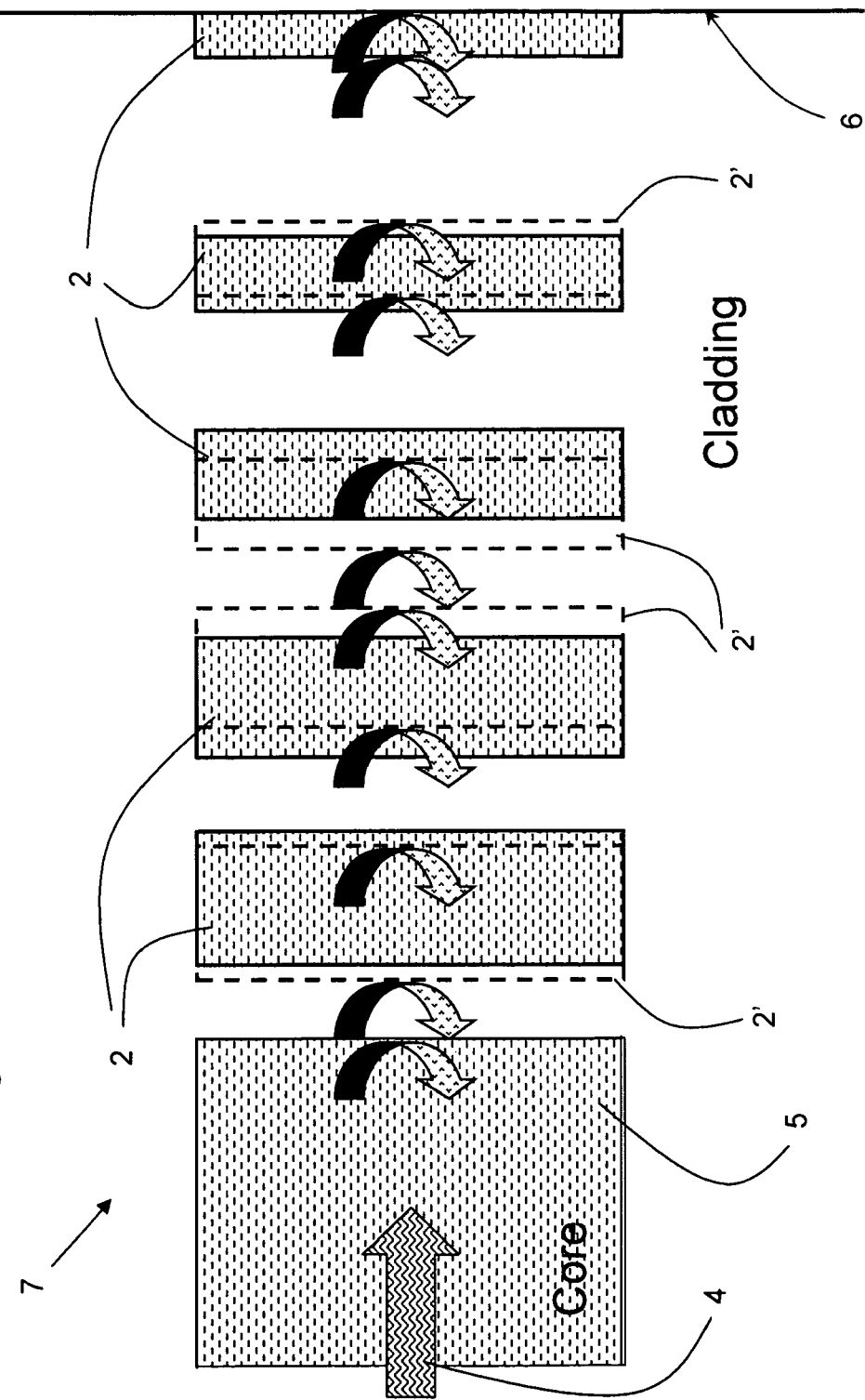
FIG. 2 illustrates a conventional segmented waveguide structure with randomly repositioned segments.
Figure 3:
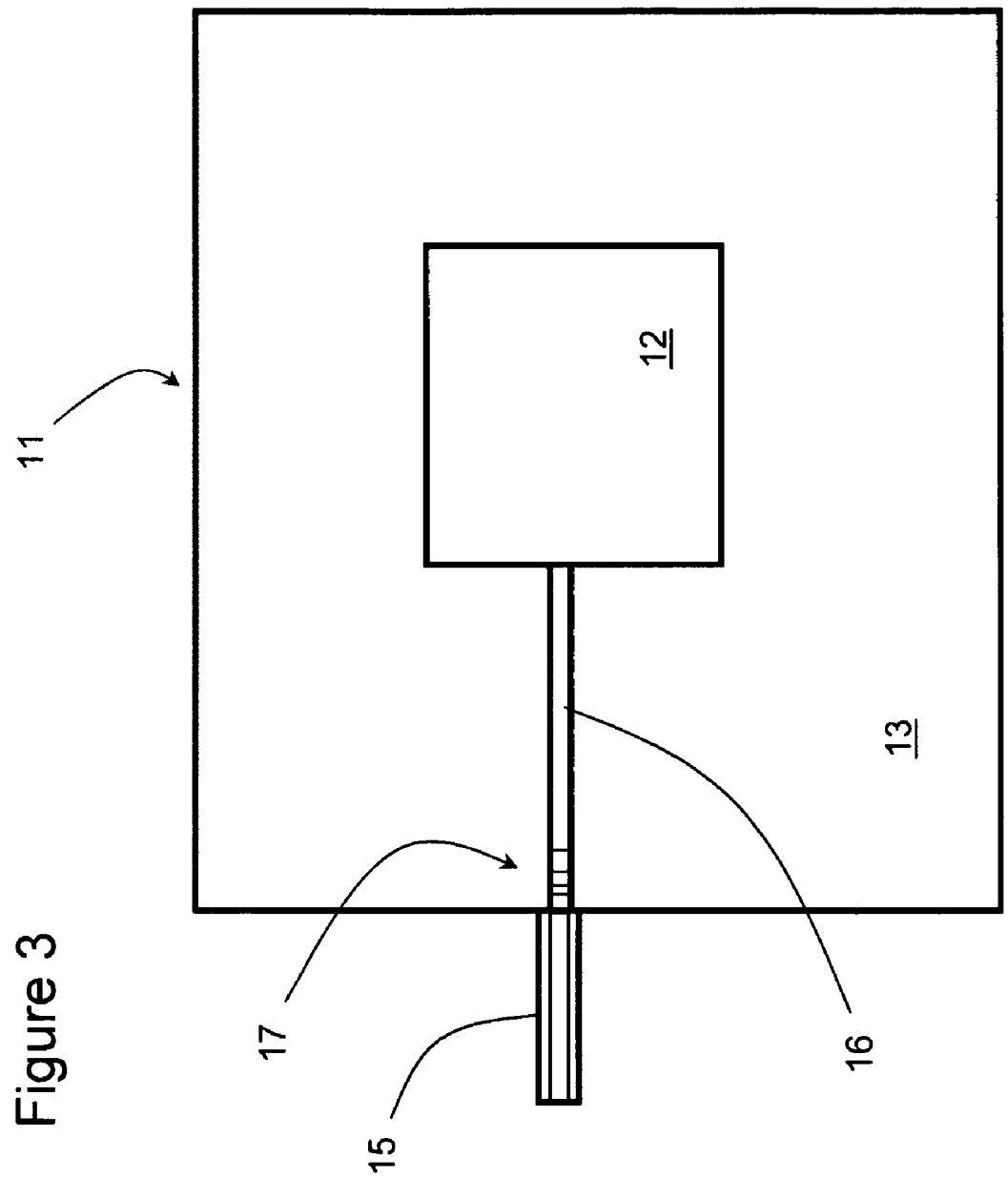
FIG. 3 illustrates a planar waveguide device including offset segmented waveguides in accordance with the present invention.
Figure 4:
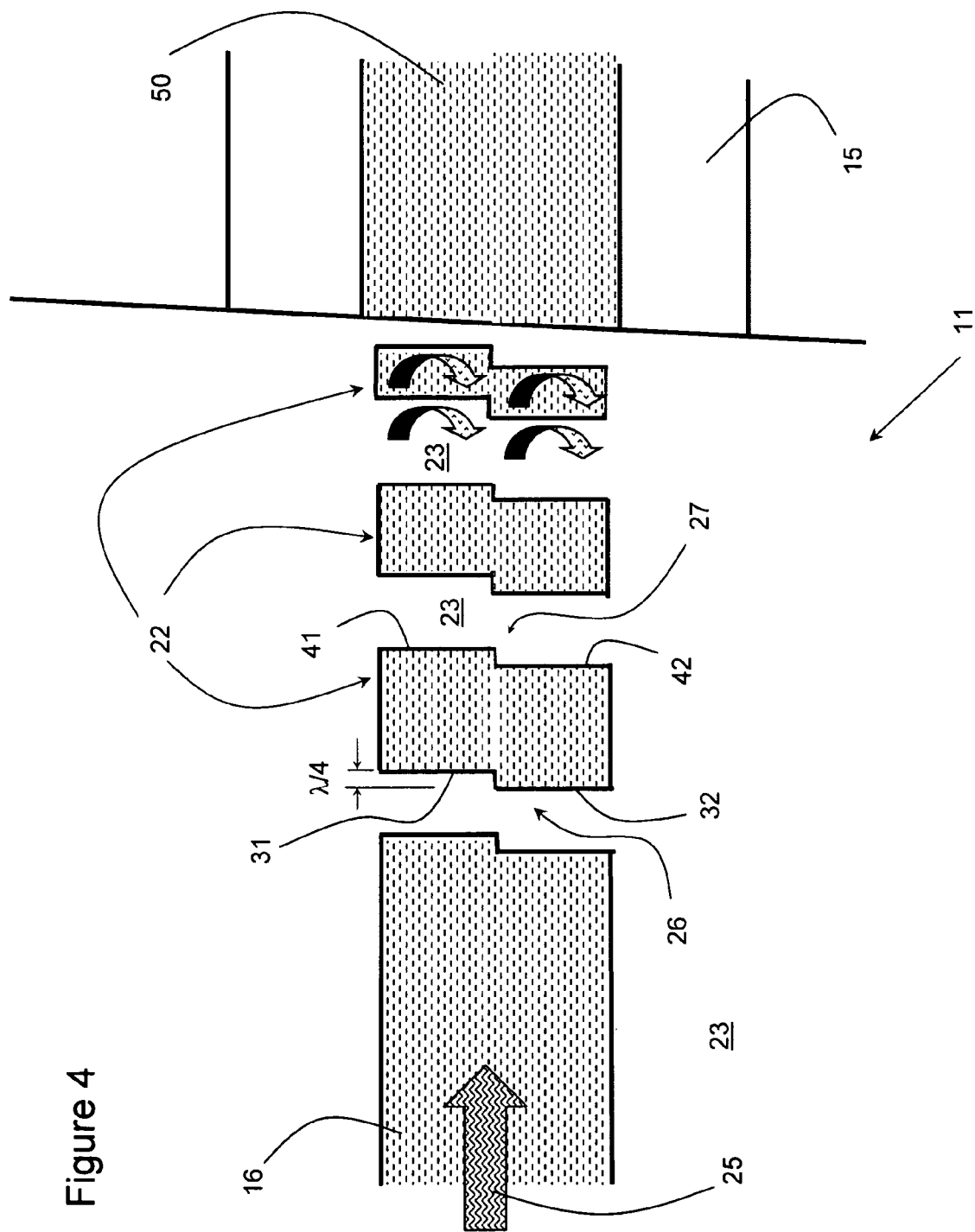
FIG. 4 illustrates the offset segmented waveguides of FIG. 3.

With reference to FIGS. 3 and 4, an exemplary planar waveguide (PLC) device 11, in accordance with the present invention includes a laser 12 mounted on a substrate 13, and optically coupled to an optical fiber 15 via a waveguide 16. In accordance with the present invention, the transition portion 17 of the waveguide 16, e.g. adjacent external optical fibers 15, has been segmented, and includes a plurality of core segments 22, e.g. five to fifty although only three shown, separated by portions of cladding 23, for gradually enables the optical mode in the waveguide 16 from the laser 12 to expand or contract to match the mode of the optical fiber 15.

The waveguide 16 is comprised of upper and lower cladding regions or layers of low refractive index, with one or more core regions of higher refractive index therebetween; however, in some embodiments, such as silicon-on-insulator (SOI), the upper cladding region may be air. Confined by the waveguiding structure, the input optical signal 25 expands horizontally in the core region, i.e. diverges in the horizontal plane. The PLC device 11 can be fabricated in silica on silicon, silica on quartz, silicon on insulator, or III-V materials, e.g. InP, GaAs or InGaAsP.

The core segments 22 have progressively smaller widths towards the ends of the waveguide 16 and/or the cladding portions 23 have progressively larger widths towards the ends of the waveguide 16, as illustrated in FIG. 4. Each core segment 22, in accordance with the present invention, includes stepped front and rear facets 26 and 27, respectively. A first section 31 of the front facet 26, having a length which is a fraction, e.g. one half, of the total length of each front facet 26, has been rearwardly offset in the direction of light transmission from a second section 32 of each front facet 26 by an amount at or approximately equal to a quarter of a wavelength ($\lambda/4$) of the light 25 requiring suppression or any odd multiple of a quarter of a wavelength ($(2n-1)\lambda/4$) of the light 25 requiring reflection suppression. Similarly, a first section 41 of the rear facet 27, having a length which is a fraction, e.g. one half, of the total length of each rear facet 27, has been rearwardly offset in the light transmission direction from a second section 42 of each rear facet 27 by an amount at or approximately equal to a quarter of a wavelength ($\lambda/4$) or any odd multiple of a quarter of a wavelength ($(2n-1)\lambda/4$) of the light 25 requiring suppression. Therefore, the field reflected back from the first sections 31 and 41 of the front and rear facets 26 and 27, respectively, will exactly cancel the fields reflected back from the second sections 32 and 42 of the front and rear facets 26 and 27, respectively.

In the illustrated embodiment of FIG. 4, all of the first and second sections 31, 32, 41 and 42 are parallel, and the first sections 31 and 32 are the same distance apart as the second sections 41 and 42; however, for the purposes of anti-reflection, the first and second sections 31 and 32 of the front facet 26 are independent of the first and second sections of the rear facet 27. For example, the front face 26 could have three faces for canceling or controlling back reflection, while the rear face 27 has only two. Moreover, the first sections 31 and 41 could be farther apart than the second sections 32 and 42. Various segment shapes will be discussed hereinafter with reference to FIGS. 9a to 9c.

The edge of the device chip 11 has been cleaved at an acute angle, e.g. 7° to 10°, to cancel or adjust the back reflections occurring at the junction of the chip 11 and the external waveguide core 50, e.g. core of optical fiber 15.

Figure 5:
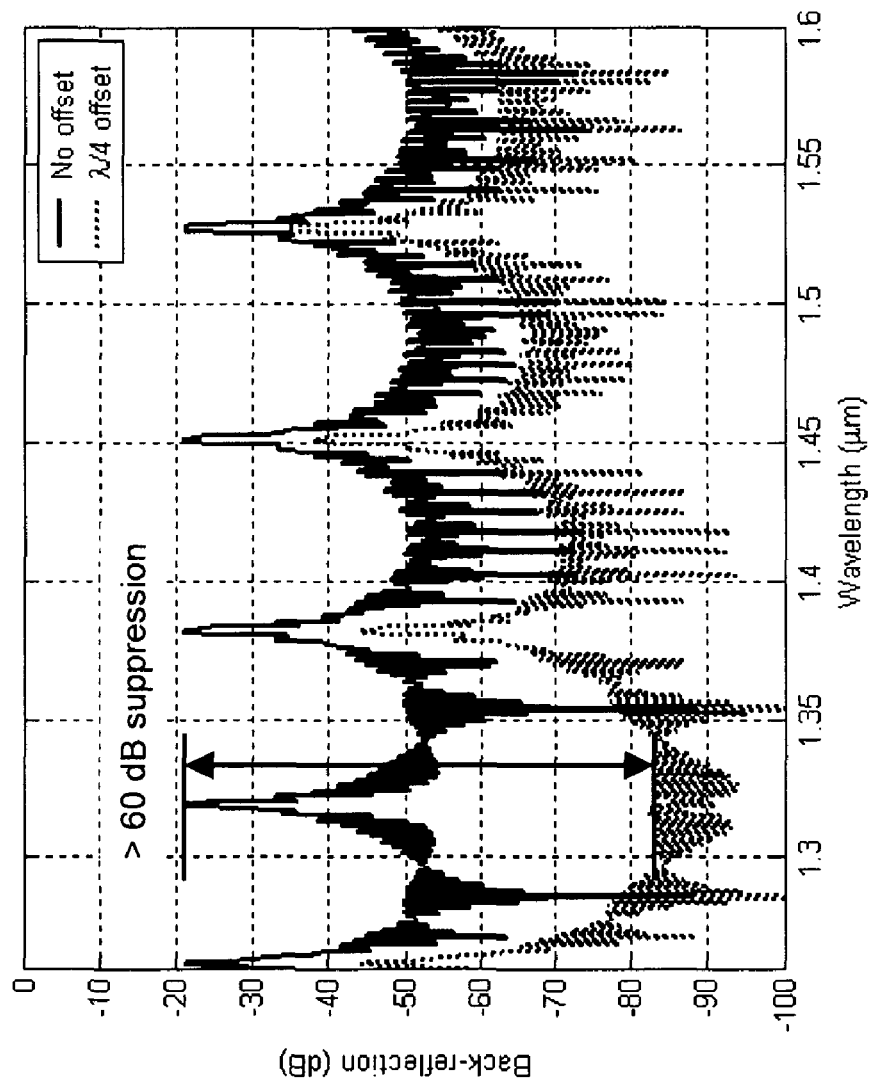
FIG. 5 illustrates a back-reflection spectrum from nearly periodic segment structure with no offset, and with quarter-wave fragmented offset segments.

With reference to FIG. 5, back-reflection spectrums from a periodically segmented structure and a structure using the fragmented-offset technique in accordance with the present invention are illustrated. Using periodically spaced segments with fragmented offsets, the back-reflection is suppressed by approximately 60 dB at the design wavelength (1.29 μm to 1.34 μm), while throughout the wavelength band shown the suppression exceeds approximately 25 dB.

Figure 6:
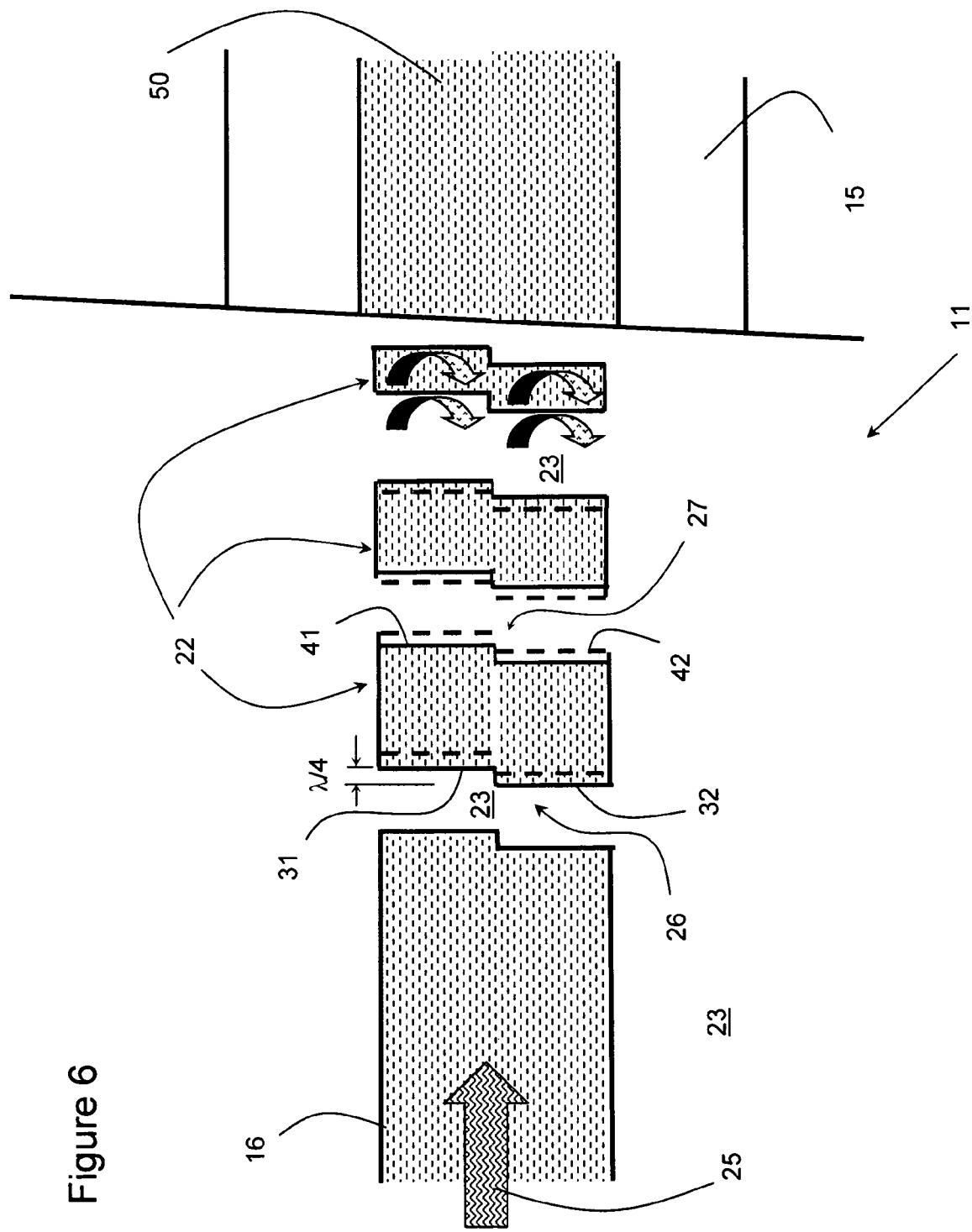
FIG. 6 illustrates an offset randomized segmented waveguide in accordance with the present invention.
Figure 7:
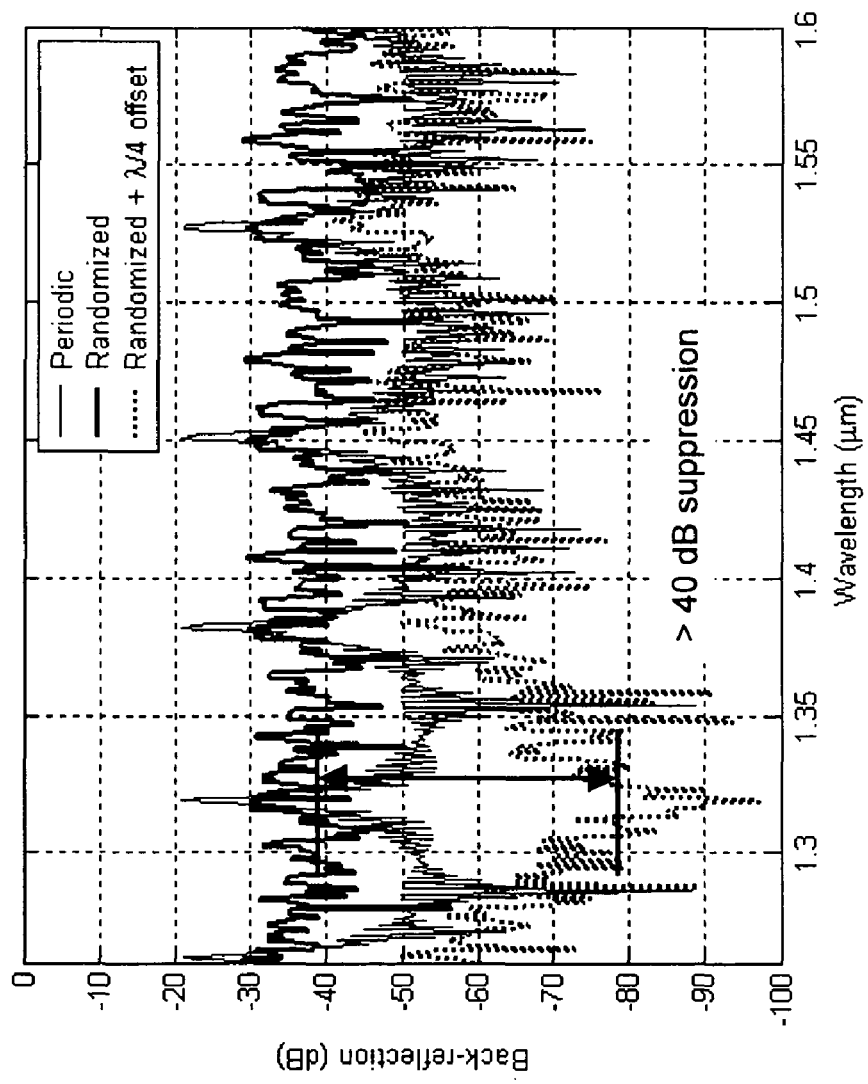
FIG. 7 illustrates a back-reflection spectrum from a nearly periodic segmented structure, a randomized segmented structure, and a randomized structure with the fragmented-offset technique of the present invention also applied.

To decrease the effect of back reflections even further, the offset core segments 22 can also be randomly distributed, as illustrated in phantom outline in FIG. 6. The back-reflection spectrum from the same periodic segmented structure as in FIG. 5, along with the periodic structure randomized, and a randomized structure with the fragmented-offset technique applied, is illustrated in FIG. 7. Even in the case of the randomized segmented structure, an additional 40 dB of suppression is provided by fragmenting the individual segments 22. Therefore, this fragmenting technique can be used to substantially reduce back reflections in periodic or non-periodic structures.

The segment fragmenting technique, according to the present invention, works because the mode inside the waveguide 16 is defined by precision photo-lithography. Therefore, in the examples shown above, the mode distribution can be balanced quite well between the first and second sections, e.g. 31 and 41, in each segment 22. The precision construction also enables additional control over the back reflections, when total suppression of all back-reflections isn't desired. For instance, multiple sections, e.g. 3 or more, can be employed, e.g. cut the waveguide segment into 3 or more sections, each with their own controlled relative offset, instead of just the two equal fragments with a quarter-wave offset, as illustrated above. In this way, the back reflection can be altered in a known way, or eliminated if required. The sections can also be angled at an acute angle, e.g. 30 to 15°, preferably 70 to 10°, to a plane perpendicular to the direction of propagation of light, if it is desired to adjust the back-reflection spectrum and to send the back-reflected radiation to a separate location, not straight back into the original waveguide.

Figure 8A:
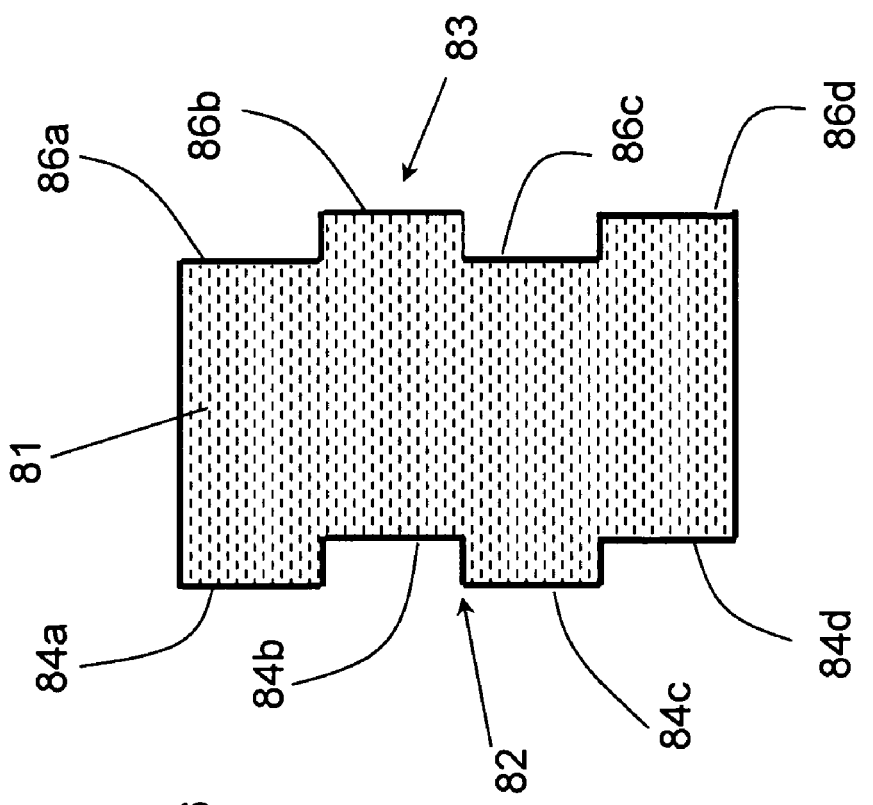
FIGS. 8a, 8b, and 8c illustrate multi-faceted segments in accordance with the present invention.
Figure 8B:
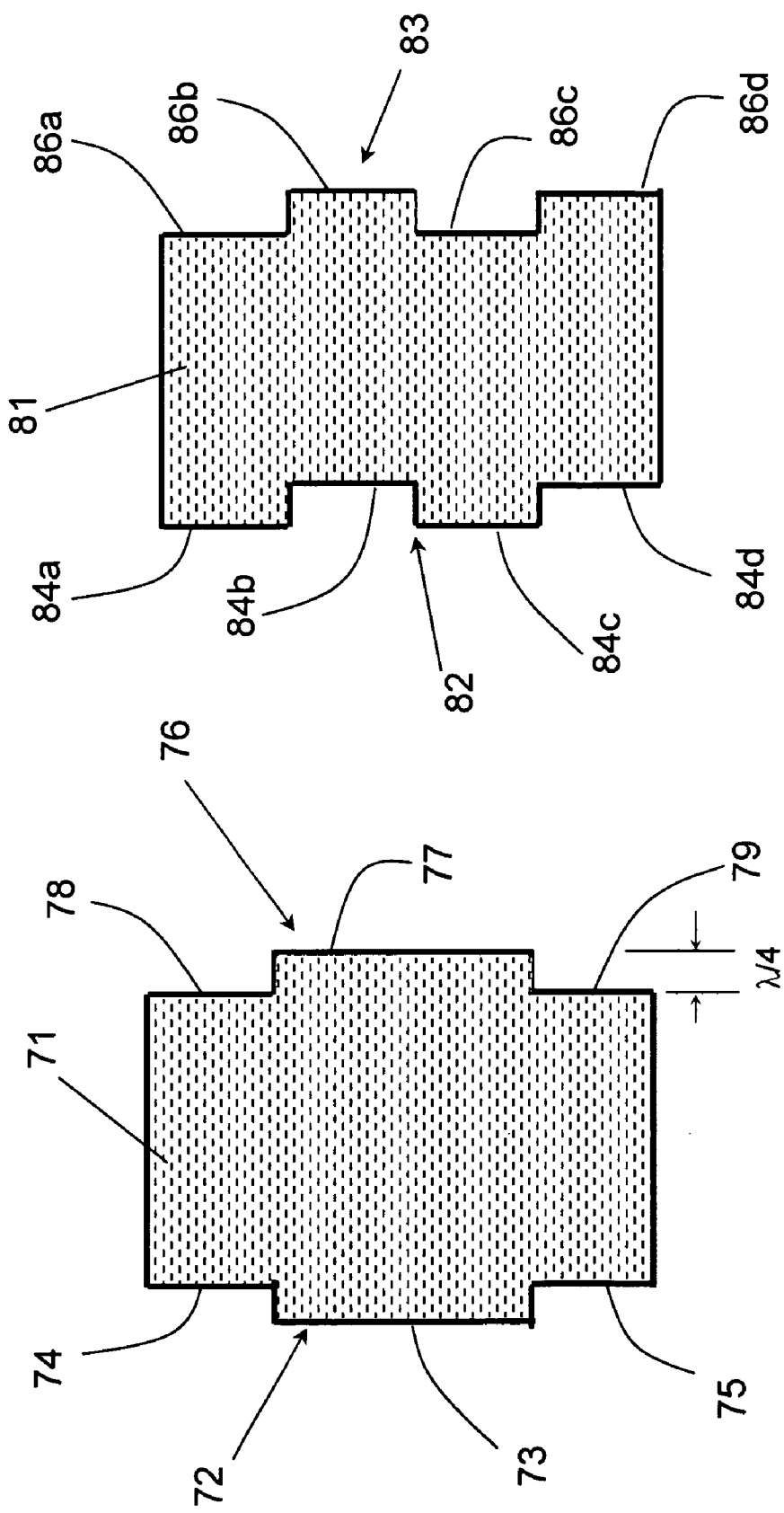
Figure 8C:
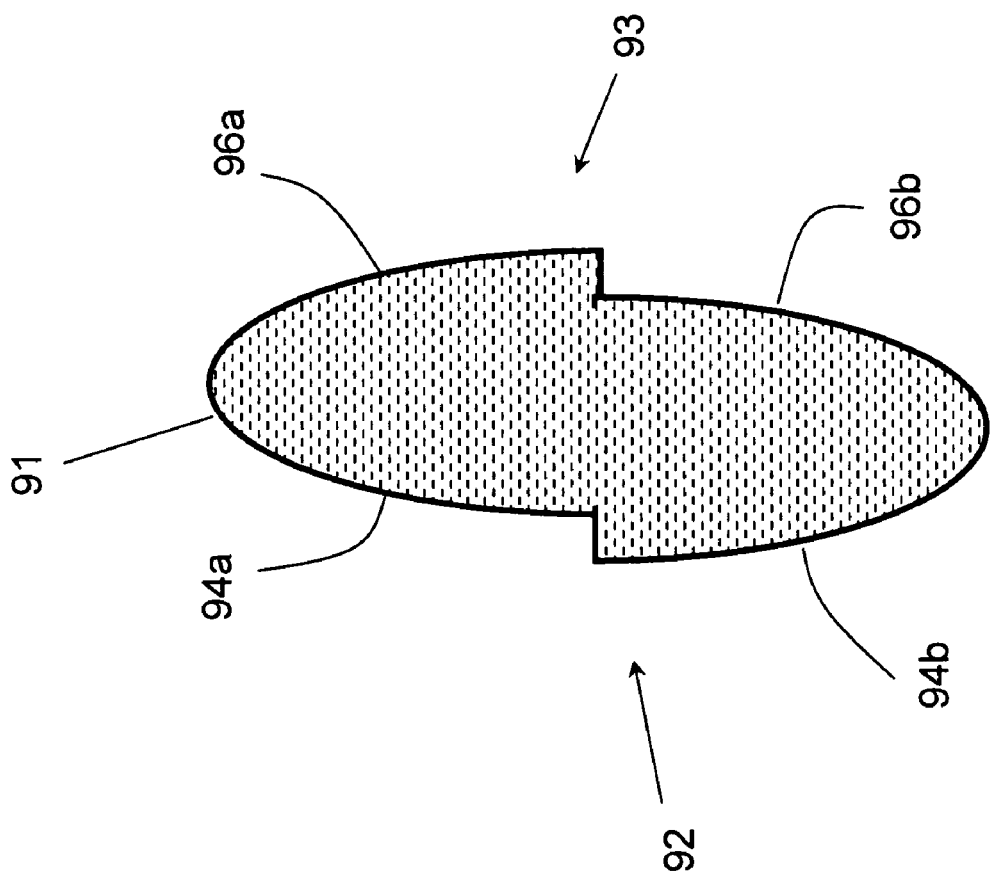

FIGS. 8a, 8b and 8c illustrate various examples of multi-faceted segments 71, 81 and 91, respectively. The segment 71, in FIG. 8a, includes a front facet 72 defined by a middle section 73 and side sections 74 and 75 on either side thereof. Similarly, rear face 76 include a middle section 77 with side sections 78 and 79 on either side thereof. As above the corresponding front and rear middle facet sections 73 and 77 are offset from the side facet sections 74 and 75, and 78 and 79 by an amount at or approximately equal to a quarter of a wavelength ($\lambda/4$) or any odd multiple of a quarter of a wavelength ($(2n-1)\lambda/4$) of the light 25 requiring suppression. In the illustrated embodiment, the length of the middle section 73 (or 77) is equal to the sum of the lengths of the side sections 74+75 (or 78+79); however, the lengths of the middle section 73 (or 77) can vary depending upon the light intensity distribution of the optical beam traveling in the waveguide, and depending upon the amount of back reflection suppression desired. For total back reflection suppression the integral of the intensity of the middle section 73 (or 77) is equal to the sum of the integrals of the intensities of the side sections 74 and 75 (or 78 and 79), assuming a relative phase offset of 180°. The distance between the middle sections 73 and 77 can be the same as the distance between side sections 74 and 78 or, as illustrated in FIG. 8a, the distance between the middle section 73 and 77 can be λ/2 of the light 25 requiring suppression (or a multiple thereof) wider than the distance between the side sections 74 and 78.

The multi-faceted segment 81 in FIG. 8b includes front and rear faces 82 and 83 with four substantially equal facet sections 84a to 84d and 86a to 86d, with adjacent facet sections offset from each other by an amount at or approximately equal to a quarter of a wavelength (λ/4) or any odd multiple of a quarter of a wavelength ((2n−1)λ/4) of the light 25 requiring suppression. Ideally, the middle sections 84b and 84c (or 86b and 86c) are equal in length to each other, and the end sections 84a and 84d (or 86a and 86d) are equal in length to each other; however, the middle sections 84b and 84 can have different lengths than the end sections 84a and 84d. For total back reflection suppression, the sum of the integral of the intensity of the sections 84a and 84c is equal to the sum of the integral of the intensity of the sections 84b and 84d, assuming a relative phase offset of 180°.

The offset multi-faceted segment 91, illustrate in FIG. 8c, includes front and rear faces 94 and 96, respectively, with curved, convex or arcuate portions, e.g. providing lensing surfaces with optical power. The front face 91 includes arcuate first and second side section 94a and 94b separated along a central axis by an offset section, which rearwardly offsets the first section 94a from the second section 94b by an amount at or approximately equal to a quarter of a wavelength (λ/4) or any odd multiple of a quarter of a wavelength ((2n−1)λ/4) of the light 25 requiring suppression. The rear face 96 includes arcuate first and second side section 96a and 96b separated along the central axis by an offset section, which rearwardly offsets the first section 96a from the second section 96b by an amount at or approximately equal to a quarter of a wavelength (λ/4) or any odd multiple of a quarter of a wavelength ((2n−1)λ/4) of the transmitted light 25 requiring suppression.

Ideally, the first and second sections 94a and 94b are mirror images of each other, but in practice the surfaces of the first and second section 94a and 94b can be substantially different, as long as the integral of the intensity of the first section 94a is equal to the integral of the intensity of the second section 94b, assuming a relative phase offset of 180° and total back reflection suppression is desired.

Figure 9:
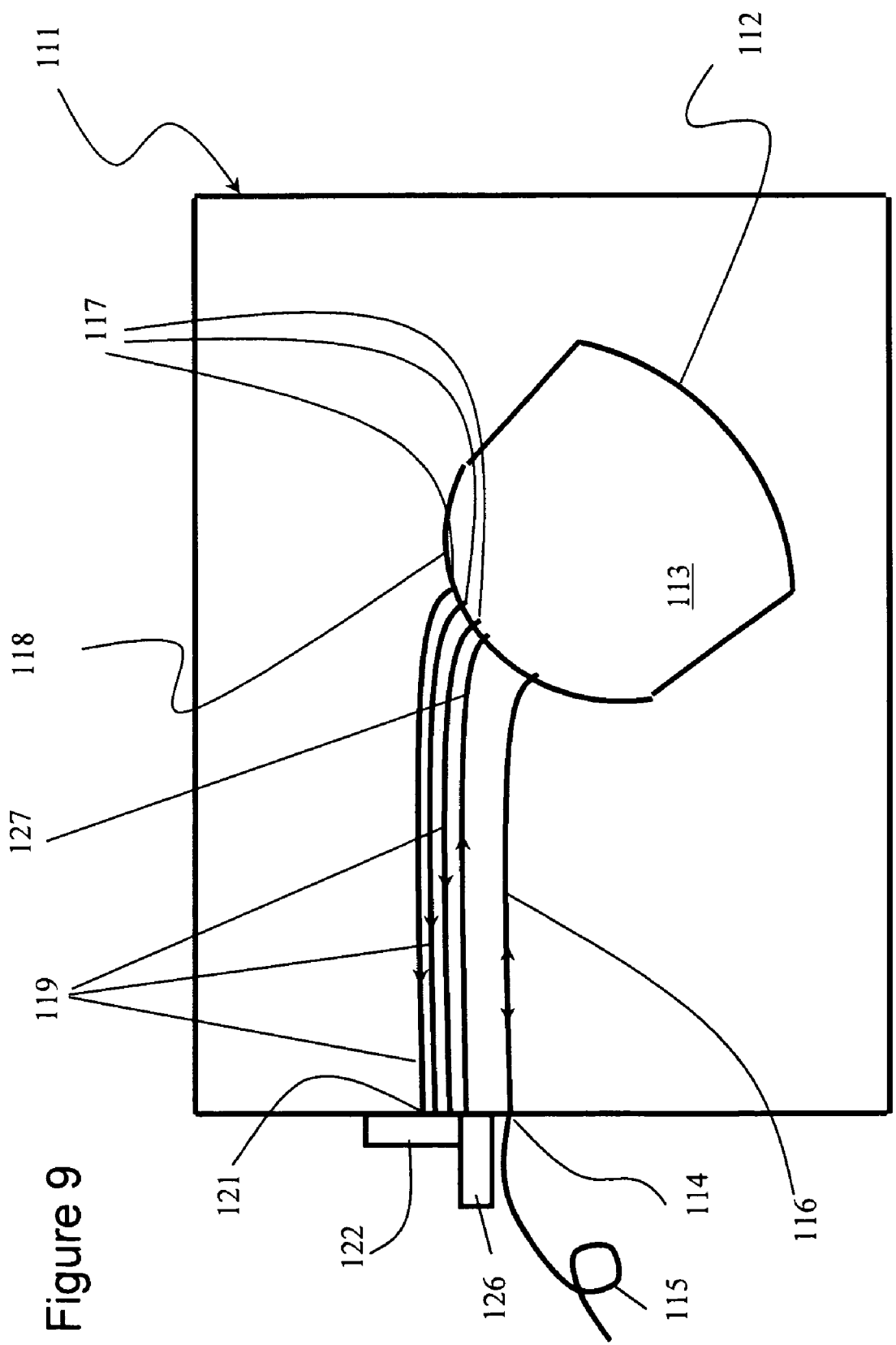
FIG. 9 illustrates an alternative planar waveguide device including offset segmented waveguides in accordance with the present invention.

With reference to FIG. 9, an exemplary planar waveguide device 111, in accordance with the present invention includes one or more diffraction gratings 112 formed at an edge or edges of a slab waveguide region 113 for dispersing an input optical signal including a plurality of wavelength channels, as disclosed in U.S. Pat. No. 7,068,885, issued Jun. 27, 2006 to Bidnyk et al, and U.S. Pat. No. 7,151,635 issued Dec. 19, 2006 to Balakrishnan et al, and U.S. Pat. No. 7,149,387 issued Dec. 12, 2006 to Pearson et al, which are incorporated herein by reference. The input optical signal is launched from an external waveguide, e.g. optical fiber 115, via an input/output port 114 along an input/output waveguide 116 to a slab inlet port of the slab waveguide 113, wherein the diffraction grating(s) 112 disperses the wavelength channels according to wavelength to slab outlet ports 117, which are positioned along a Rowland circle 118. The separated wavelength channels propagate along output waveguides 119 to output ports 121. The output ports 121 can be optically coupled to a photo-detector array 122, to other optical devices or to optical fibers (not shown). Alternatively, the output waveguides 119 can transmit individual wavelength channels from the outlet ports 121 to the diffraction grating 112 for multiplexing onto the input/output waveguide 116 and outputting the input/output port 114, as disclosed in U.S. Provisional Patent Application 61/073,152, filed Jun. 17, 2008, which is incorporated herein by reference.

When the device 111 is utilized for bi-directional transmission, a laser 126 mounted on an edge of the device 111, emits an output optical signal along laser waveguide 127, which gets filtered and redirected by the diffractions grating(s) 112 to the input/output waveguide 116 for output the input/output port 114.

The slab waveguide 113 is defined by a waveguiding structure, which confines the light to predominantly two dimensions, while restricting the diffraction of the light in the third dimension. Typically, the slab waveguide 113, like the waveguides 116, 119 and 127, is comprised of upper and lower cladding regions or layers of low refractive index, with one or more core regions of higher refractive index therebetween; however, in some embodiments, such as silicon-on-insulator (SOI), the upper cladding region may be air. Confined by the waveguiding structure, the input optical signal expands horizontally in the core region, i.e. diverges in the horizontal plane. The circuit 111 can be fabricated in silica on silicon, silica on quartz, silicon on insulator, or III-V materials, e.g. InP, GaAs or InGaAsP.

For a diplexer or a triplexer the relevant passbands are 100 nm for the laser, and approximately 20 nm for the detector channels. Such a device would be impractical to implement with a single diffractive structure because the various channels would share a common physical dispersion. Assume that a spectrometer slab region has been chosen such that the smallest reasonable guiding waveguide widths handle the 20 nm passbands at the grating output. The waveguide width necessary for the 100 nm passband channel would be so wide as to support innumerable modes, creating a device with high sensitivity to fabrication tolerances if a reversible path is necessary for this channel.

Figure 10:
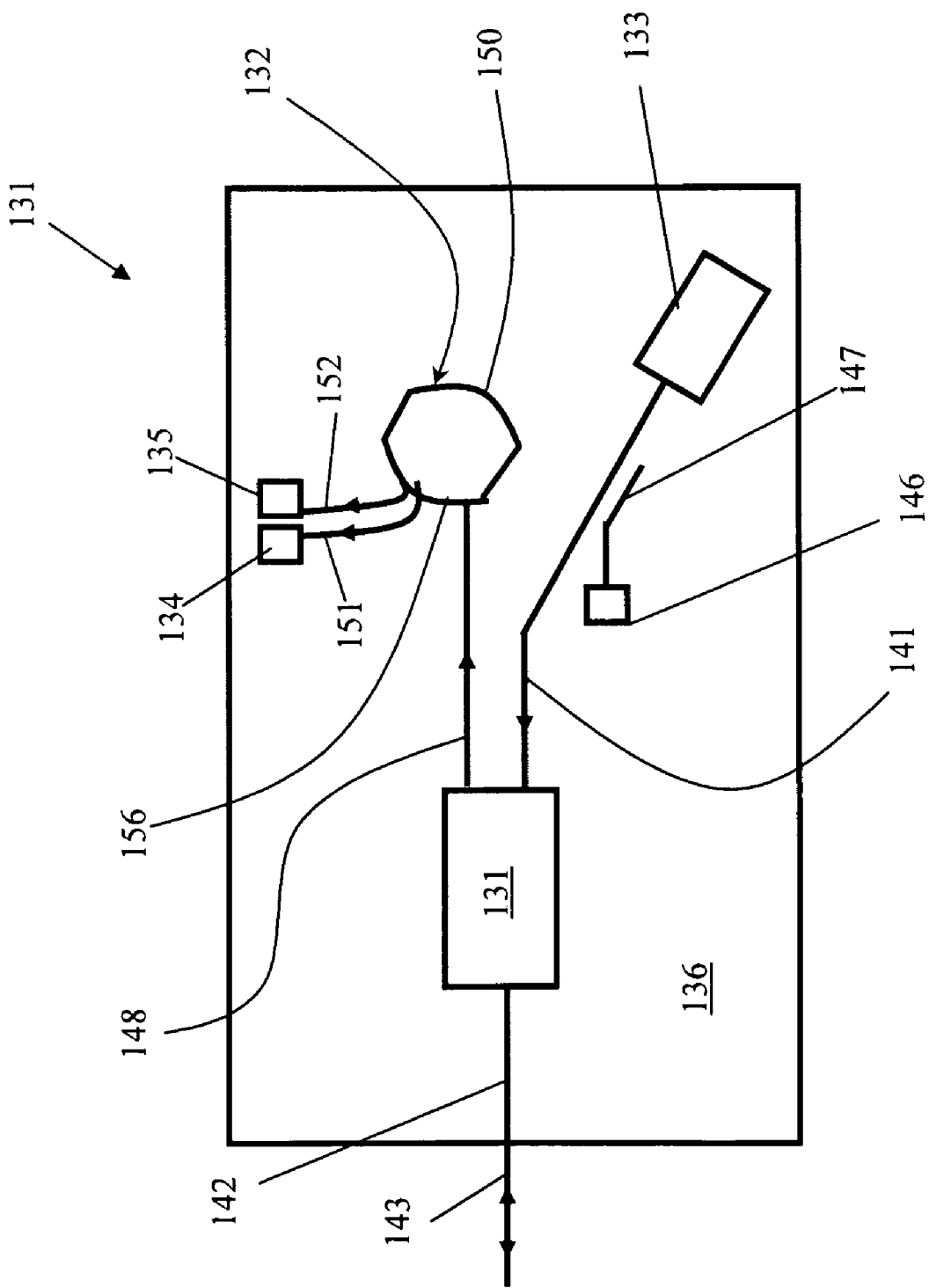
FIG. 10 illustrates an alternative planar waveguide device including offset segmented waveguides in accordance with the present invention.

With reference to FIG. 10, a two-stage optical filter according to the present invention includes a non-dispersive filter 131, a dispersive filter 132, a laser source 133, and first and second photo-detectors 134 and 135 formed in or on a planar lightwave circuit (PLC) chip 136. A single photo-detector 134 can be provided, when one of the detector channels is omitted. Preferably, the non-dispersive filter 131 is a wavelength selective directional coupler, i.e. two parallel waveguides of specific width, spacing and coupling length, which separates the receiver channels from the laser channel. Alternatively, the non-dispersive filter 131 can be a wavelength dependent modal interference (MMI) filter or a phase dependent wavelength splitter, e.g. a Mach Zehnder interferometer designed for splitting wavelength bands. Instead of a single-stage coupler, a multi-stage coupler or MMI can be used, which provides flatter passbands than those commonly produced by single-stage filters, which slightly improves the insertion loss at the outer edges of the channels, where the passbands from the single-stage filters begin to roll off.

The laser source 133 transmits the data channel along waveguide 141 to the non-dispersive filter 131, which multiplexes the data channel onto output waveguide 142. A system waveguide 143, e.g. an optical fiber, is optically coupled to the output waveguide 142 at the edge of the PLC chip 136. A monitor photodiode 146 can be positioned proximate the back facet of the laser source 133; however, the structure of the present invention enables the monitor photodiode 146 to be positioned upstream of the laser source 133 optically coupled thereto via a tap coupler 147, which separates a small portion (2%) of the laser light. Back facet monitors measure the light produced by the laser, but not what is actually coupled to the waveguide 141, i.e. into the PLC chip 136;

however, the downstream photodiode 146 is able to directly measure what light has been coupled in the waveguide 141.

The detector channels must pass through both stages of the filter, i.e. the non-dispersive filter 131 and the dispersive filter 132, via waveguide 148, and are processed by the grating-based dispersive filter 132. Preferably, the dispersive filter 132 includes a concave reflective diffraction grating 150 with a focal line 156, preferably defined by a Rowland circle.

Typical grating-based demultiplexers exhibit relatively sharp passbands that are difficult to make wide and flat, as required for the bi-directional transceiver application. Accordingly, the present invention incorporates multi-mode output waveguides 151 and 152 at output ports along the focal line 156. The multi-mode waveguides 151 and 152 support an innumerable collection of modes, which serves to flatten the spectral response of the grating output. Alternatively, the first and second output waveguides 151 and 152 include a multi-mode section adjacent to the first and second ports, respectively, and a single mode section remote therefrom for providing the diffraction grating filter 150 with a flattened spectral response. The waveguides 151 and 152 direct the light from the output ports to the first and second photodetectors 134 and 135, respectively.

The present invention achieves the varying passbands for the detector and signal channels by incorporating a dual-stage filter, in which the laser channel is separated from the detector channels, which are further demultiplexed with a dispersive element of higher resolution. The passband of the laser channel is therefore determined by the first stage of the filter, e.g. the wavelength-selective directional coupler 131, while the passband of the detector channels is determined predominantly by the second stage of the filter, e.g. grating-based dispersive element 132. The directional coupler 131 can be designed to easily cover a passband of 100 nm, while the detector channels undergo further processing by the grating.

In accordance with the present invention, the transition portions of each waveguide 116, 119, 127, 141, 142, 148, 151 and 152, e.g. adjacent external optical fibers 115 and 143 and/or slab waveguide regions 113 or 132, and/or optical components 122, 126, 131, 134 and 135 can be segmented and include core segments 62, 72, 82 or 92 separated by portions of cladding, as illustrated in FIGS. 4, 6, 8a, 8b and 8c for gradually enabling the optical mode in the waveguide to expand or contract to match the mode of the optical fiber neighboring structure.

We claim:

1. A planar lightwave circuit (PLC) device comprising:
a waveguide structure including:
a core for transmitting optical signals in a light transmission direction, having a transition area at an end thereof for optically coupling to an adjacent optical element, wherein the transition area of the core includes core segments separated by cladding sections in the light transmission direction for mode matching the optical signals between the core and the adjacent optical element; and
cladding surrounding the core for guiding the optical signals substantially in the core;
wherein each core segment includes a first face and a second face through which the optical signals pass in the light transmission direction;
wherein the first face includes a first section and a second section; and
wherein the first section is rearwardly offset from the second section, whereby back reflections from the first section of the first face at least partially cancel back reflections from the second section of the first face.

2. The device according to claim 1, wherein the offset between the first and second sections of the first face is an odd number of quarter wavelengths at a nominal wavelength at which reduced back reflection is desired.

3. The device according to claim 1, wherein the second face includes a first section and a second section; and
wherein the first section is rearwardly offset from the second section, whereby back reflections from the first section of the second face at least partially cancel back reflections from the second section of the second face.

4. The device according to claim 3, wherein the offset between the first and second sections of the second face is an odd number of quarter wavelengths at a nominal wavelength at which reduced back reflection is desired.

5. The device according to claim 1, wherein each of the first and second sections of the first face are perpendicular to the light transmission direction.

6. The device according to claim 1, wherein each of the first and second sections of the first face are at an acute angle to the light transmission direction.

7. The device according to claim 1, wherein the first and second sections include arcuate sections.

8. The device according to claim 7, wherein the first face is substantially a mirror image of the second face.

9. The device according to claim 1, wherein the first section is defined by an integral of intensity for the optical signals in the light transmission direction;
wherein the second section is defined by an integral of intensity for the optical signals in the light transmission direction;
wherein the integral of the intensity of the first section is equal to the integral of the intensity of the second section; and
wherein the offset provides a relative phase offset of 180°.

10. The device according to claim 1, wherein the core segments have progressively smaller widths in the light transmission direction.

11. The device according to claim 1, wherein the cladding portions have progressively larger widths in the light transmission direction.

12. The device according to claim 1, wherein the first face includes a third section coplanar with the first section.

13. The device according to claim 9, wherein the first face includes a fourth section coplanar with the second section.

14. The device according to claim 1, wherein the core segments are randomly spaced to further reduce back reflection at desired wavelengths.

15. The device according to claim 1, wherein the transition area is at an edge of the PLC device, whereby the core segments are for mode matching the optical signals between the core and an optical fiber optically coupled to the edge of the PLC device.

* * * * *